(12) United States Patent
Kuwajima et al.

(10) Patent No.: US 8,289,467 B2
(45) Date of Patent: Oct. 16, 2012

(54) LIQUID CRYSTAL DISPLAY DEVICE

(75) Inventors: Yuka Kuwajima, Mobara (JP); Eiji Oohira, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 580 days.

(21) Appl. No.: 12/554,084

(22) Filed: Sep. 4, 2009

(65) Prior Publication Data
US 2010/0053493 A1    Mar. 4, 2010

(30) Foreign Application Priority Data
Sep. 4, 2008 (JP) ................. 2008-226892

(51) Int. Cl.
*G02F 1/1333* (2006.01)
*G02F 1/1335* (2006.01)
(52) U.S. Cl. ............ 349/58; 349/61; 362/613; 362/97.3
(58) Field of Classification Search .......... 349/56, 349/58, 61, 65; 362/612–613, 621, 97.1, 362/97.2, 97.3
See application file for complete search history.

(56) References Cited

U.S. PATENT DOCUMENTS
2007/0019127 A1    1/2007 Oohira

FOREIGN PATENT DOCUMENTS
JP    2007-025484    2/2007

*Primary Examiner* — Uyen Chau N Le
*Assistant Examiner* — Michael Mooney
(74) *Attorney, Agent, or Firm* — Antonelli, Terry, Stout & Kraus, LLP.

(57) ABSTRACT

The first line and the plurality of second lines are formed on the light-emitting diode substrate and on the connection substrate. The plurality of second lines are arranged, on the connection substrate, in the same direction as a direction in which the plurality of light-emitting diodes mounted on the light-emitting diode substrate are arranged. The first line is formed outside the plurality of second lines, on the connection substrate. The plurality of second lines are formed without intersecting with one another, on the light-emitting diode substrate. The first line is formed, on the light-emitting diode substrate, so that the first line extends along with a periphery of the light-emitting diode substrate from a connection part with respect to the connection substrate so as to come around to an opposite side of the connection part with respect to the connection substrate.

7 Claims, 8 Drawing Sheets

LIQUID CRYSTAL DISPLAY DEVICE

CROSS-REFERENCE TO RELATED APPLICATION

The present application claims priority from Japanese application JP 2008-226892 filed on Sep. 4, 2008, the content of which is hereby incorporated by reference into this application.

BACKGROUND OF THE INVENTION

1. Field of the Invention

The present invention relates to a liquid crystal display device, and more particularly, to a technology which is effectively applicable to a flexible printed wiring board provided with light-emitting diodes mounted thereon.

2. Description of the Related Art

A liquid crystal display device (also referred to as liquid crystal display module) of a thin film transistor (TFT) system, which includes a compact liquid crystal display panel, is widely used as a display part of portable equipment such as a mobile phone.

FIG. 10 is an exploded perspective diagram illustrating a schematic configuration of a conventional liquid crystal display device for a mobile phone.

As illustrated in FIG. 10, the conventional liquid crystal display device includes a liquid crystal display panel (LCD) and a backlight (B/L) for illuminating the liquid crystal display panel (LCD).

The backlight (B/L) includes a light guide plate 6 which has a substantially rectangular shape similar to a plane shape of the liquid crystal display panel (LCD), white light-emitting diodes (light sources; hereinafter, referred to as LEDs) 8 disposed on a side surface (light incident surface) of the light guide plate 6, a reflection sheet 7 disposed on a lower surface (surface on a side opposite to the liquid crystal display panel side) of the light guide plate 6, an optical sheet group 5 disposed on an upper surface (surface on the liquid crystal display panel side) of the light guide plate 6, and a molded resin frame (hereinafter, simply referred to as mold) 10. The optical sheet group 5 is formed by including, for example, a lower diffusion sheet, two lens sheets, and an upper diffusion sheet.

In the conventional liquid crystal display device, the optical sheet group 5, the light guide plate 6, and the LEDs 8 are disposed inside the mold 10 in the order as illustrated in FIG. 10. The reflection sheet 7 is disposed below the mold 10.

Further, the liquid crystal display panel (LCD) includes a pair of glass substrates (2a and 2b), an upper polarizer 1 attached to an upper surface (display surface) of the glass substrate 2a, and a lower polarizer 3 attached to a lower surface (surface on the backlight side) of the glass substrate 2b.

The glass substrate 2b is provided with a semiconductor chip (DRV) mounted thereon which constitutes a driver or the like. Note that, on the glass substrate 2b, a flexible printed wiring board for supplying a control signal or the like to the semiconductor chip (DRV) is also mounted, however, the flexible printed wiring board is not illustrated in FIG. 10.

Patent Document which discloses the related art of the present invention is JP 2007-25484 A.

FIG. 11 is a cross sectional diagram illustrating a main part of the conventional liquid crystal display device, in which the flexible printed wiring board (FPC) is mounted on the glass substrate 2b. Note that the mold 10 is not illustrated in FIG. 11. Further, FIG. 12 is a plan view illustrating a developed state of the flexible printed wiring board (FPC) illustrated in FIG. 11.

As illustrated in FIG. 12, the flexible printed wiring board (FPC) includes a main body part 20 on which a connection part 21 for connection to the glass substrate 2b and a connection part 22 for external connection (for example, to a mobile phone) are formed, an LED substrate 24 on which the LEDs 8 are mounted, and a connection substrate 23 for connecting the main body part 20 and the LED substrate 24 to each other. Here, the main body part 20 and the LED substrate 24 are each formed of a double-sided flexible printed wiring board, and the connection substrate 23 is formed of a single-sided flexible printed wiring board.

Further, as illustrated in FIG. 11, the connection substrate 23 is folded. As a result, a plurality (four in this case) of the LEDs 8 mounted on the LED substrate 24 are disposed within the mold 10 (not shown) from below the mold 10.

FIG. 13 is a diagram for describing a wiring pattern on the connection substrate 23 and on the LED substrate 24 illustrated in FIG. 11.

In the liquid crystal display device provided with the flexible printed wiring board (FPC) illustrated in FIG. 11, the four LEDs 8 mounted on the LED substrate 24 are driven in parallel with one another. Accordingly, on the connection substrate 23 and on the LED substrate 24 illustrated in FIG. 11, a common anode line (AN) for supplying an anode voltage to all the (four in this case) LEDs 8 and four cathode lines (CN1 to CN4) for supplying a cathode voltage to each of the four LEDs 8 are formed.

In this case, on the connection substrate 23, the anode line (AN) and the four cathode lines (CN1 to CN4) may be wired such that those lines do not intersect with one another.

Meanwhile, on the LED substrate 24, it is necessary to connect the four cathode lines (CN1 to CN4) to each of cathode electrodes (CDE) of the four LEDs 8 while connecting the anode line (AN) to anode electrodes (ADE) of the four LEDs 8. As a result, the anode line (AN) intersects with three of the cathode lines (CN2 to CN4), and hence the LED substrate 24 needs to be a double-sided printed wiring board.

As a result, as illustrated by the arrow A of FIG. 11, the LED substrate 24 which is formed of a double-sided printed wiring board is increased in thickness to exceed the thickness of the reflection sheet 7, and the excess of the LED substrate 24 is formed downwards the reflection sheet 7 due to the difference in thickness, with the result that it has been difficult to reduce the thickness of the liquid crystal display device.

SUMMARY OF THE INVENTION

The present invention has been made to solve the above-mentioned problems inherent in the related art, and it is an object of the invention to provide a liquid crystal display device which is reduced in thickness to a degree not heretofore attained.

The above-mentioned object is made clear, together with other objects and novel features of the present invention, in the description given herein with reference to the accompanying drawings.

Among aspects of the invention disclosed in the present application, representative aspects are briefly described as follows.

(1) According to a first aspect of the present invention, a liquid crystal display device includes: a liquid crystal display panel including a first substrate, a second substrate, and liquid crystal held between the first substrate and the second substrate; and a backlight, in which the liquid crystal display panel includes a flexible printed wiring board which is connected to a side of the first substrate. The liquid crystal display device further includes: a wide LED substrate on which n (≧2) number of light-emitting diodes are mounted; and a connection substrate for connecting the LED substrate and the flexible printed wiring board to each other, in which: the LED substrate includes a first line for supplying a first power supply voltage to all the n number of light-emitting diodes and n number of second lines for supplying a second power supply voltage to each of the n number of light-emitting diodes; the first line and the n number of second lines are also formed on the connection substrate; the n number of second lines on the connection substrate are sequentially formed one by one with respect to each of the n number of light-emitting diodes mounted on the LED substrate; the first line on the connection substrate is formed outside the n number of second lines; the n number of second lines on the LED substrate are formed without intersecting with one another; and the first line on the LED substrate is formed so that the first line extends along with a periphery of the LED substrate from a connection part with respect to the connection substrate so as to come around to an opposite side of the connection part with respect to the connection substrate.

(2) According to a second aspect of the present invention, a liquid crystal display device includes: a liquid crystal display panel including a first substrate, a second substrate, and liquid crystal held between the first substrate and the second substrate; and a backlight, in which the liquid crystal display panel includes a flexible printed wiring board which is connected to a side of the first substrate. The liquid crystal display device further includes: a wide LED substrate on which n (≧2) number of light-emitting diodes are mounted; and a connection substrate for connecting the LED substrate and the flexible printed wiring board to each other, in which: the LED substrate includes n number of first lines for supplying a first power supply voltage to each of the n number of light-emitting diodes and n number of second lines for supplying a second power supply voltage to each of the n number of light-emitting diodes; the n number of first lines and the n number of second lines on the LED substrate are formed so that each of the first lines and each of the second lines are formed in a pair without intersecting with each other for each of the light-emitting diodes; the n number of first lines and the n number of second lines are also formed on the connection substrate; n pairs of the first lines and the second lines for each of the light-emitting diodes on the connection substrate are sequentially formed one by one with respect to each of the n number of light-emitting diodes mounted on the LED substrate; and the n number of first lines on the flexible printed wiring board are connected, via a switching line formed on an opposite surface of the flexible printed wiring board, to a common line connected to an interface part.

(3) According to a third aspect of the present invention, in the second aspect of the invention, any one of the n number of first lines also serves as the common line, the first lines other than the any one of the n number of first lines also serving as the common line are connected, on the flexible wiring board, to the switching line via a contact hole, and the switching line is connected, via another contact hole, to the any one of the n number of first lines also serving as the common line.

(4) According to a fourth aspect of the present invention, in any one of the first to third aspects of the invention, the number of first lines and the number of second lines are different from each other on the LED substrate between a left direction and a right direction with respect to the connection part with the connection substrate.

(5) According to a fifth aspect of the present invention, in any one of the first to fourth aspects of the invention, the flexible printed wiring board includes a double-sided printed wiring board, and the LED substrate and the connection substrate each include a single-sided printed wiring board.

(6) According to a sixth aspect of the present invention, in any one of the first to fifth aspects of the invention, the LED substrate and the connection substrate are formed integrally with each other.

(7) According to a seventh aspect of the present invention, in any one of the first to sixth aspects of the invention, the connection substrate includes a substrate in an elongated shape which is smaller in substrate width than the LED substrate.

(8) According to an eighth aspect of the present invention, in any one of the first to seventh aspects of the invention, the connection substrate is folded, and the n number of light-emitting diodes mounted on the LED substrate are accommodated in a mold from a side of the mole, the side being opposite to a side where the liquid crystal display panel is provided.

An effect of the present invention, which is obtained by the representative embodiments of the invention, is briefly described as follows.

According to the present invention, it is possible to provide a liquid crystal display device reduced in thickness to a degree not heretofore attained.

DETAILED DESCRIPTION OF THE INVENTION

Hereinafter, embodiments of the present invention are described in detail with reference to the accompanying drawings.

It should be noted that, in all the drawings for describing the embodiments, the same reference symbols are used to denote the same components provided with the same function, and redundant descriptions thereof are omitted.

First Embodiment

A liquid crystal display device according to embodiments of the present invention includes a liquid crystal display device of a TFT system provided with a compact liquid crystal display panel, which is used as a display part of portable equipment such as a mobile phone.

The liquid crystal display device according to a first embodiment of the present invention also includes a liquid crystal display panel and a backlight disposed on a backside of the liquid crystal display panel with respect to an observer of the liquid crystal display panel.

Figure 1A:
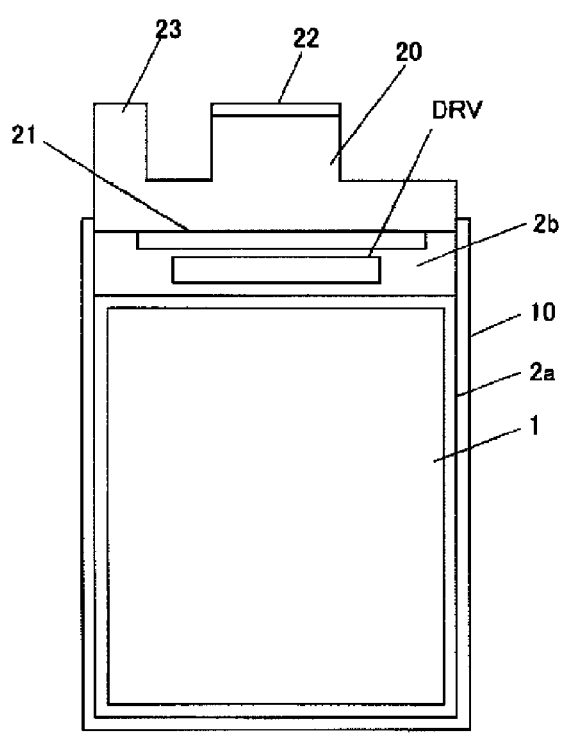
FIG. 1A is a diagram illustrating a liquid crystal display device according to a first embodiment of the present invention.
Figure 1B:
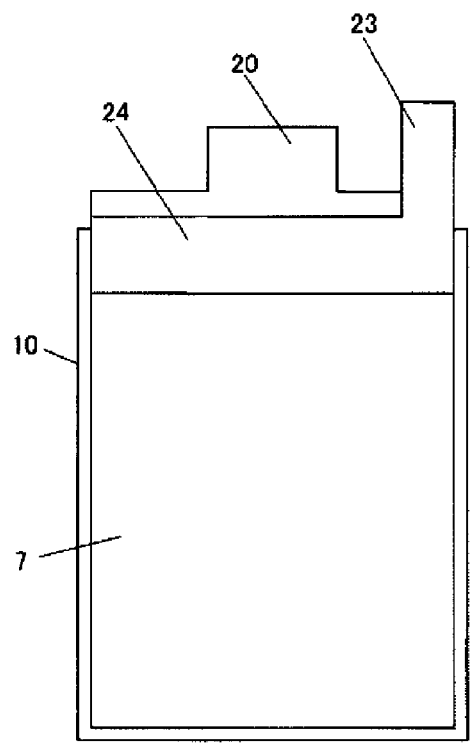
FIG. 1B is a diagram illustrating the liquid crystal display device according to the first embodiment of the present invention.

FIGS. 1A and 1B each are a diagram illustrating the liquid crystal display device according to the first embodiment. FIG. 1A illustrates the liquid crystal display device viewed from top (from the liquid crystal display panel side, the front side, or the observer side), and FIG. 1B illustrates the liquid crystal display device viewed from below (from the light guide plate side, the backside, or the rear side).

Figure 2:
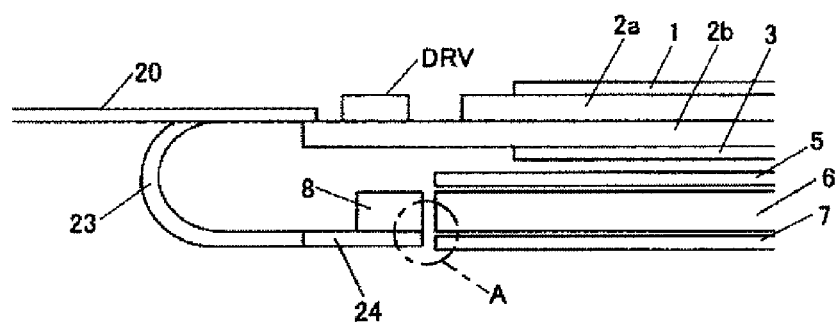
FIG. 2 is a cross sectional diagram illustrating a main part of the liquid crystal display device according to the first embodiment of the present invention, in which a flexible printed wiring board is mounted on a glass substrate.

FIG. 2 is a cross sectional diagram illustrating a main part of the liquid crystal display device according to the first embodiment of the present invention, in which a flexible printed wiring board (FPC) is mounted on a glass substrate 2b. In FIG. 2, a mold 10 is not illustrated.

To form the liquid crystal display panel (LCD), the glass substrate (also referred to as TFT substrate) 2b on which a pixel electrode, a thin film transistor, and the like are formed is overlapped with a glass substrate (also referred to as counter substrate) 2a on which a color filter or the like is formed, the glass substrate 2a and the glass substrate 2b are attached to each other across a predetermined distance therebetween through a frame-like seal material formed in proximity to the peripheral portions of both of the substrates, liquid crystal is filled through a liquid crystal inlet port formed in part of the seal material to be enclosed inside the seal material between both of the substrates, and polarizers (1 and 3) are attached outside the substrates.

Further, on the glass substrate 2b, a semiconductor chip (DRV) for forming a driver or the like is mounted. Still further, on one side of the glass substrate 2b, a flexible printed wiring board for providing a control signal or the like to the semiconductor chip (DRV) is mounted.

It should be noted that the material for the substrate is not limited to glass, and may also include plastic or the like, as long as the material imparts an insulating property to the substrate. Further, the color filter may be formed on the TFT substrate side, rather than the counter substrate side.

The counter electrode may be formed on the counter substrate side in a case where the liquid crystal display panel is of a twisted nematic (TN) system or a vertical alignment (VA) system. In a case where the liquid crystal display panel is of an in-plane switching (IPS) system, the counter electrode is formed on the TFT substrate side. The internal structure of the liquid crystal display panel is irrelevant to the present invention, and therefore the detailed description of the internal structure of the liquid crystal display panel is omitted. Further, the present invention is applicable to any liquid crystal display panel regardless of the structure thereof.

In the liquid crystal display device according to the first embodiment, the backlight (B/L) includes an optical sheet group 5, a light guide plate 6, a reflection sheet 7 disposed below the light guide plate 6, and white light-emitting diodes (hereinafter, referred to as LEDs) 8 disposed on a side surface of the light guide plate 6. Here, the optical sheet group 5 is formed by including a lower diffusion sheet, two lens sheets, and an upper diffusion sheet.

Figure 10:
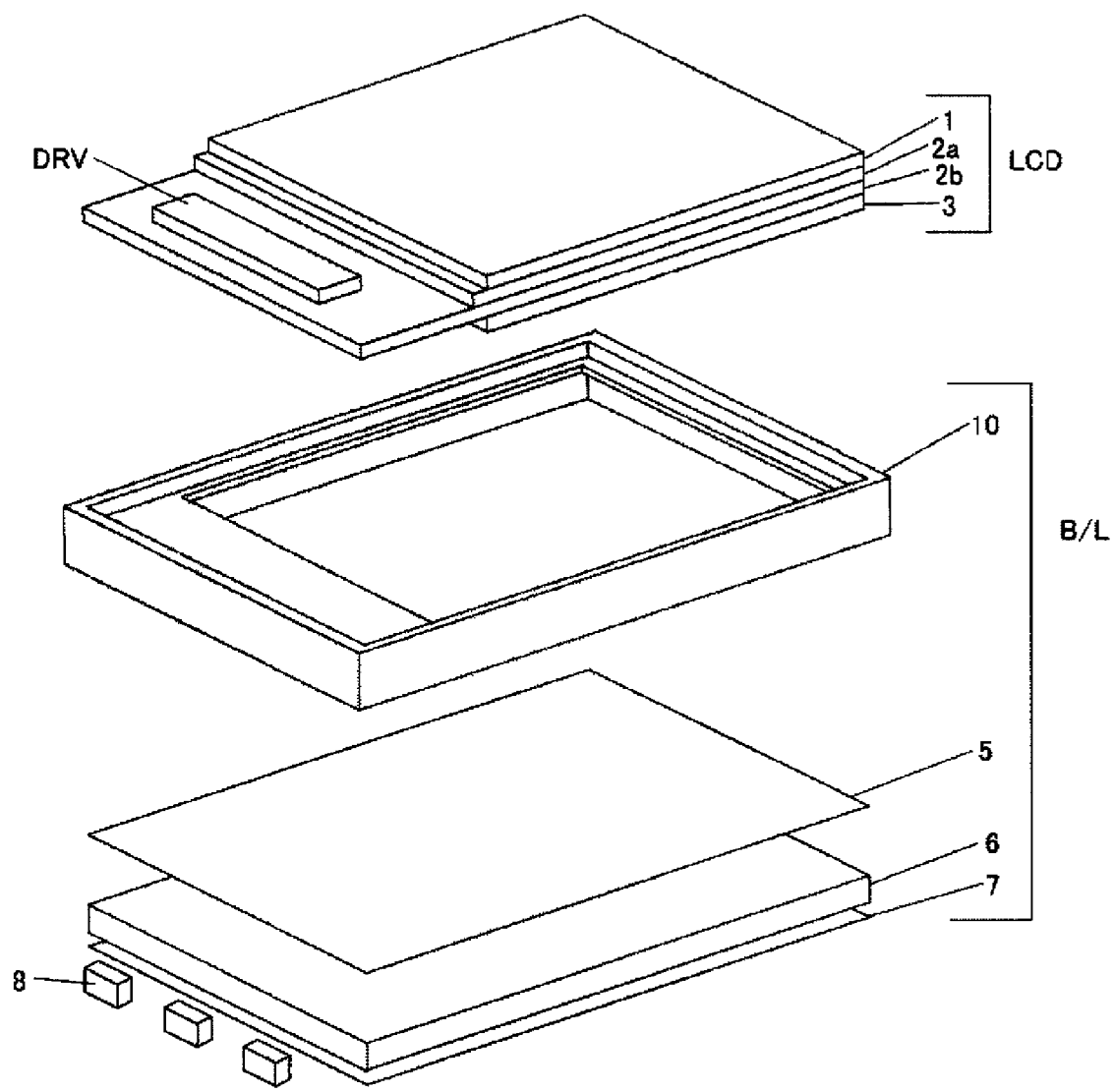
FIG. 10 is an exploded perspective diagram illustrating a schematic configuration of a conventional liquid crystal display device.
Figure 11:
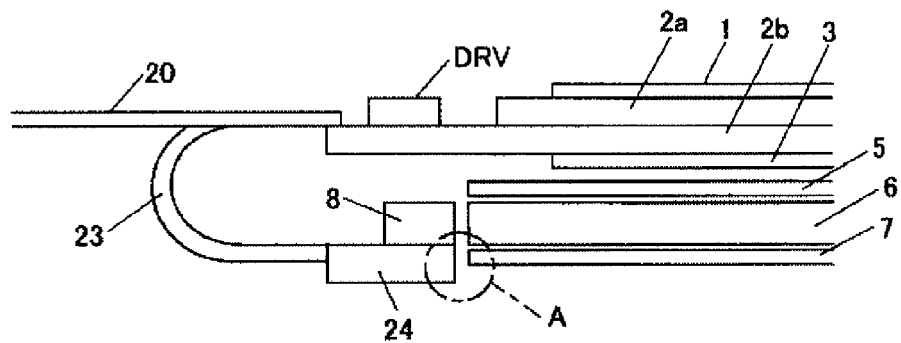
FIG. 11 is a cross sectional diagram illustrating a main part of the conventional liquid crystal display device, in which a flexible printed wiring board is mounted on a glass substrate.
Figure 12:
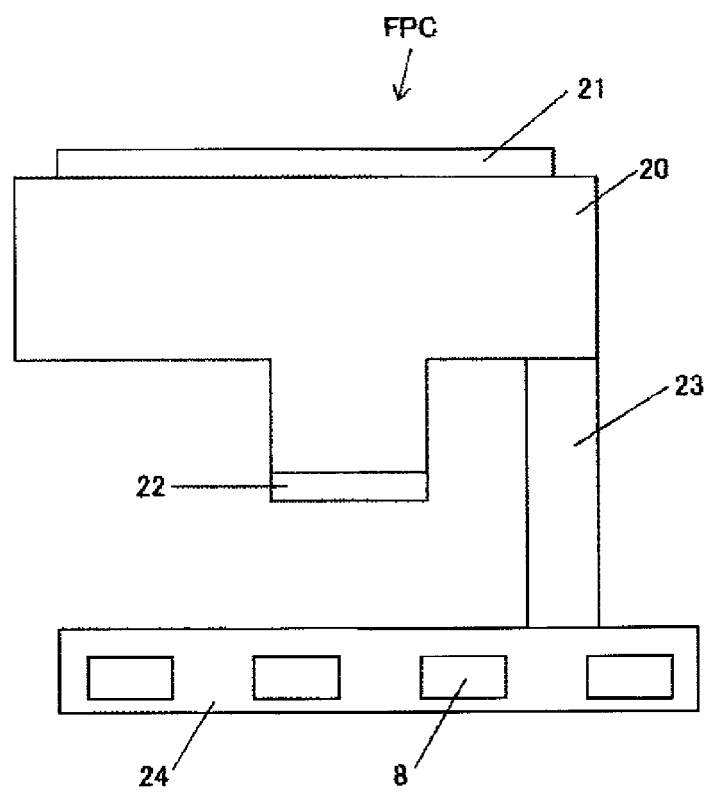
FIG. 12 is a plan view for describing a developed state of the flexible printed wiring board illustrated in FIG. 11.
Figure 13:
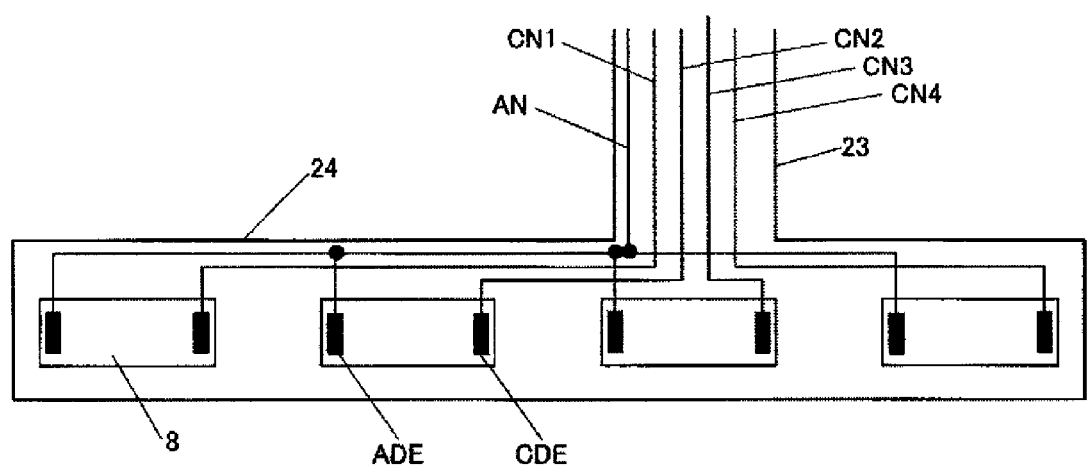
FIG. 13 is a diagram for describing a wiring pattern formed on a connection substrate and an LED substrate illustrated in FIG. 11.

In the backlight according to the first embodiment, as in the conventional liquid crystal display device, the optical sheet group 5, the light guide plate 6, and the reflection sheet 7 are disposed in the mold 10 in the order as illustrated in FIG. 10, to thereby form the backlight.

The LEDs 8 are mounted on an LED substrate 24 which is described later, and disposed from below of the mold 10 to be provided on a side surface of the light guide plate 6 within the mold 10. Here, the reflection sheet 7 is attached (or adhered) and fixed to the mold 10 by a pressure sensitive adhesive double coated tape (adhesive member).

Figure 3:
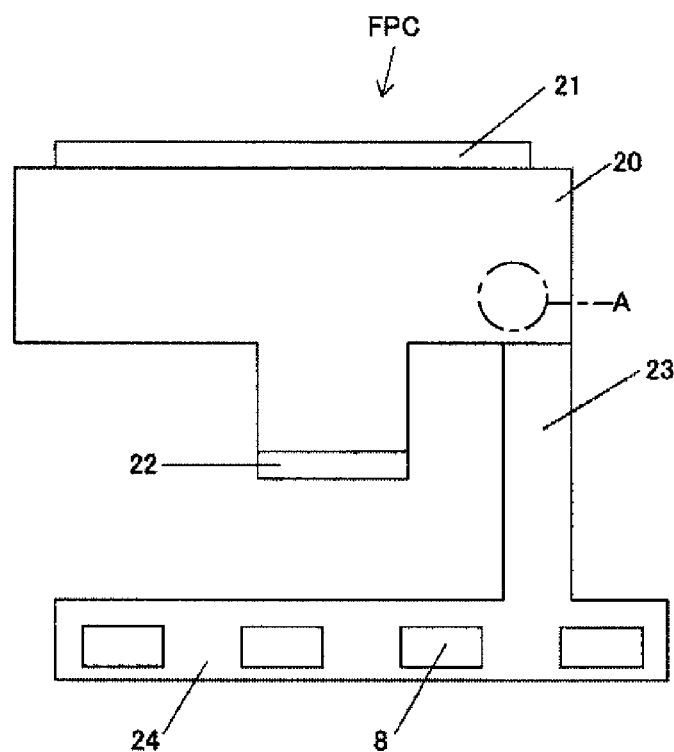
FIG. 3 is a plan view for describing a developed state of the flexible printed wiring board illustrated in FIG. 2.

FIG. 3 is a plan view illustrating a developed state of the flexible printed wiring board (FPC) illustrated in FIG. 2.

The flexible printed wiring board (FPC) according to the first embodiment also includes, as illustrated in FIG. 3, a main body part 20 on which a connection part 21 for connection to the glass substrate 2b and a connection part (interface part) 22 for external connection (for example, to a mobile phone) are formed, the LED substrate 24 on which the LEDs 8 are mounted, and a connection substrate 23 for connecting the main body part 20 and the LED substrate 24 to each other.

In the first embodiment, the main body part 20 is formed of a double-sided flexible printed wiring board. However, the first embodiment is different from the above-mentioned conventional liquid crystal display device in that the LED substrate 24 and the connection substrate 23 are each formed of a single-sided flexible printed wiring board.

As illustrated in FIG. 2, the connection substrate 23 is folded. As a result, a plurality (four in this case) of the LEDs 8 mounted on the LED substrate 24 are disposed from below the mold 10 (not shown) to be disposed on a side surface of the light guide plate 6 within the mold 10.

Figure 4:
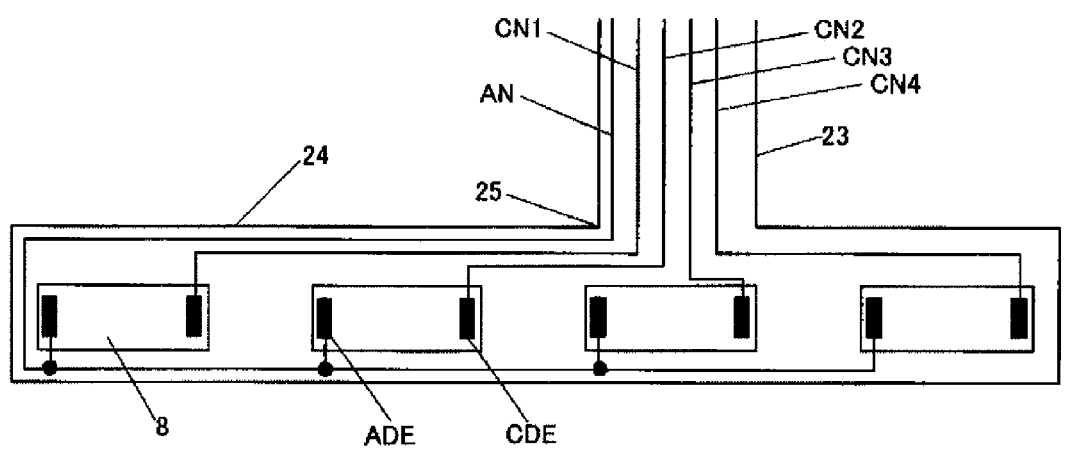
FIG. 4 is a diagram for describing a wiring pattern on a connection substrate and on an LED substrate LED illustrated in FIG. 2.

FIG. 4 is a diagram for describing a wiring pattern on the connection substrate 23 and on the LED substrate LED 24 illustrated in FIG. 2.

In the liquid crystal display device according to the first embodiment, the four LEDs 8 mounted on the LED substrate 24 are driven in parallel with one another. Accordingly, on the connection substrate 23 and on the LED substrate 24 illustrated in FIG. 2, a common anode line (AN) for supplying an anode voltage to all the (four in this case) LEDs 8 and four cathode lines (CN1 to CN4) for supplying a cathode voltage to each of the four LEDs 8 are formed. Note that another end of the common anode line (AN) and another end of each of the four cathode lines (CN1 to CN4) are connected to the connection part 22 formed on the main body part 20 of the flexible printed wiring board (FPC), and supplied with an anode voltage and a cathode voltage from, for example, a power supply circuit (for example, switching regulator) in a mobile phone.

In this case, on the connection substrate 23, the four cathode lines (CN1 to CN4) are sequentially formed one by one with respect to each of the four LEDs 8 mounted on the LED substrate 24, and therefore the anode line (AN) and the four cathode lines (CN1 to CN4) may be wired, on the connection substrate 23, such that those lines do not intersect with one another.

Further, according to the first embodiment, on the LED substrate 24, the anode line (AN) is formed such that the anode line (AN) extends, from the connection part 25 provided between the connection substrate 23 and the LED substrate 24, along with the periphery of the LED substrate 24 so as to come around to the opposite side of the connection part 25 with respect to the connection substrate 23.

With this configuration, on the LED substrate 24, the anode line (AN) connected to anode electrodes (ADE) of the four LEDs 8 and the four cathode lines (CN1 to CN4) connected to each of cathode electrodes (CDE) of the four LEDs 8, respectively, are provided such that those lines do not intersect with one another.

Accordingly, in the liquid crystal display device according to the first embodiment, a single-sided flexible printed wiring board may be used as the LED substrate 24, which prevents the LED substrate 24 from being formed downwards the reflection sheet 7, with the result that it is possible to reduce the thickness of the liquid crystal display device.

Second Embodiment

Figure 5:
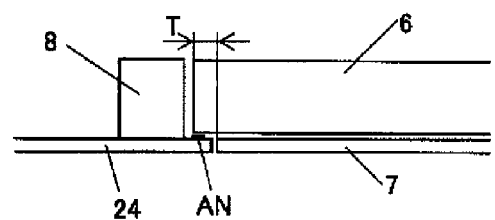
FIG. 5 is an enlarged diagram illustrating a part A of FIG. 2.

FIG. 5 is an enlarged diagram illustrating a portion corresponding to the part A of FIG. 2.

In the first embodiment described above, the anode line (AN) is formed on the light guide plate 6 side on the LED substrate 24. Accordingly, the light guide plate 6 has a portion (portion indicated by T of FIG. 5) which is not covered with the reflection sheet 7, which may lead to a case where a leakage of light may occur from the portion. According to a second embodiment of the present invention, it is possible to prevent the leakage of light.

Figure 6:
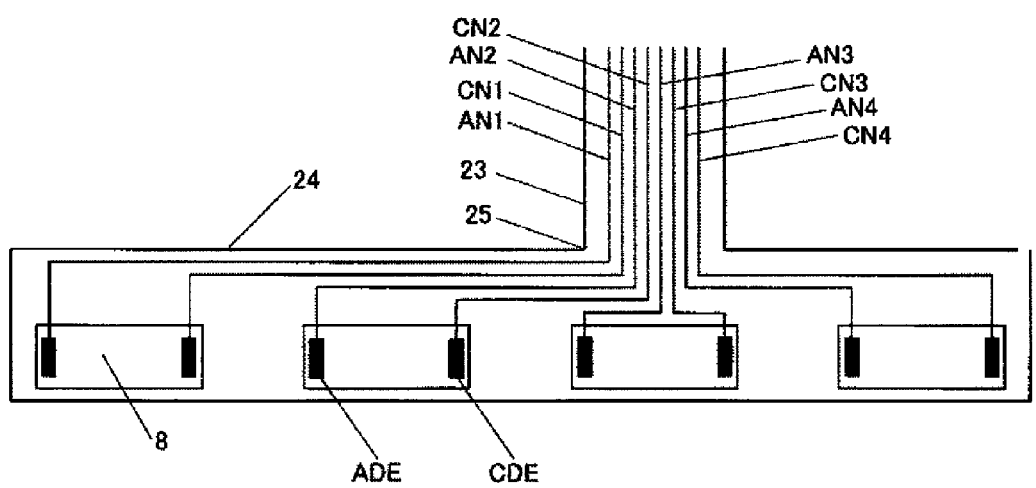
FIG. 6 is a diagram for describing a wiring pattern on a connection substrate and on an LED substrate according to a second embodiment of the present invention.

FIG. 6 is a diagram for describing a wiring pattern on the connection substrate 23 and on the LED substrate 24 according to the second embodiment of the present invention.

According to the second embodiment, on the connection substrate 23 and on the LED substrate 24, four anode lines (AN1 to AN4) and four cathode lines (CN1 to CN4) are formed.

On the connection substrate 23, the four anode lines (AN1 to AN4) and the four cathode lines (CN1 to CN4) are formed such that each of the four anode lines (AN1 to AN4) and each of the four cathode lines (CN1 to CN4) are formed in a pair with respect to each of the LEDs 8, and the pair is sequentially formed one by one for each of the four LEDs 8 mounted on the LED substrate 24.

With this configuration, on the connection substrate 23, the four anode lines (AN1 to AN4) and the four cathode lines (CN1 to CN4) may be wired such that the four anode lines (AN1 to AN4) and the four cathode lines (CN1 to CN4) do not intersect with one another.

Further, according to the second embodiment, each of the anode lines and each of the cathode lines are formed in a pair with respect to each of the LEDs 8. Therefore, even on the LED substrate 24, n pairs of the anode lines and the cathode lines on the connection substrate 23, the anode lines each being paired with each of the cathode lines, each may be connected to the anode electrode (ADE) and the cathode electrode (CDE) of corresponding one of the LEDs 8, respectively, such that the anode lines (AN1 to AN4) and the cathode lines (CN1 to CN4) do not intersect with one another.

According to the second embodiment, as illustrated in FIG. 6, the anode lines (AN2 to AN4) are formed in between the four cathode lines (CN1 to CN4).

Figure 7:
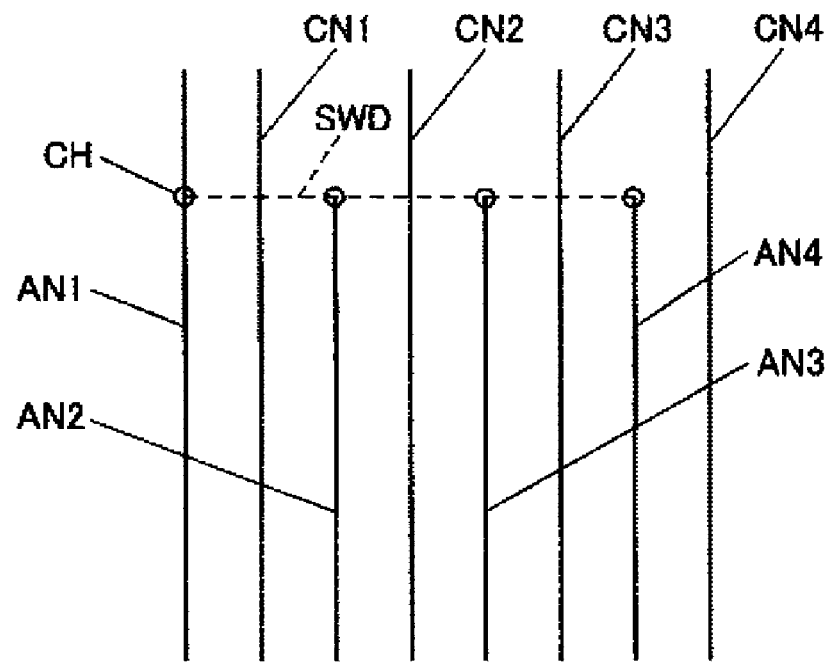
FIG. 7 is a diagram for describing a wiring pattern of anode lines provided on the flexible printed wiring board illustrated in FIG. 2.

Accordingly, according to the second embodiment, as illustrated in FIG. 7, in the main body part 20 (for example, a portion illustrated as the part A of FIG. 3) of the flexible printed wiring board (FPC), the three anode lines (AN2 to AN4) are connected to a common anode line (AN) via a switching line (SWD). The switching line (SWD) is formed on a surface of the flexible printed wiring board (FPC), the surface being opposite to a surface on which the anode line (AN1) and the four cathode lines (CN1 to CN4) are formed. The common anode line (AN) is connected to the connection part (interface part) 22 for connection to a mobile phone. It should be noted that FIG. 7 illustrates a case where the anode line (AN1) also serves as the common anode line (AN).

Figure 8:
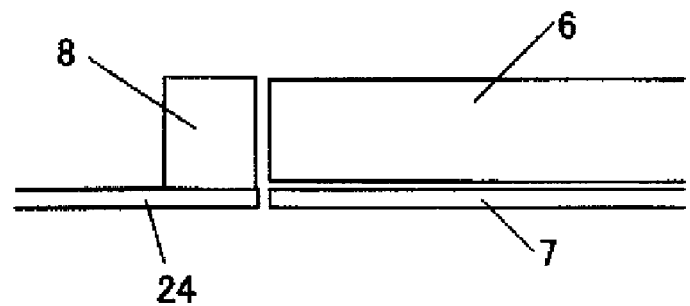
FIG. 8 is an enlarged diagram illustrating a portion corresponding to the part A of FIG. 2, of the liquid crystal display device according to the second embodiment of the present invention.

FIG. 8 is an enlarged diagram illustrating a portion corresponding to the part A of FIG. 2 of the liquid crystal display device according to the second embodiment. As illustrated in FIG. 8, according to the second embodiment, it is possible to cover the light guide plate 6 entirely with the reflection sheet 7, to thereby prevent the leakage of light described above with reference to FIG. 5.

Figure 9C:
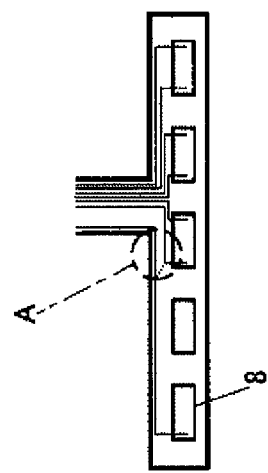
FIG. 9C is a diagram illustrating further another modification example of the flexible printed wiring board according to the embodiments of the present invention.
Figure 9B:
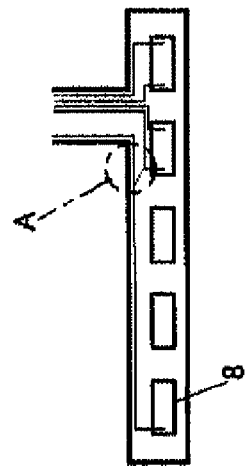
FIG. 9B is a diagram illustrating another modification example of the flexible printed wiring board according to the embodiments of the present invention.
Figure 9A:
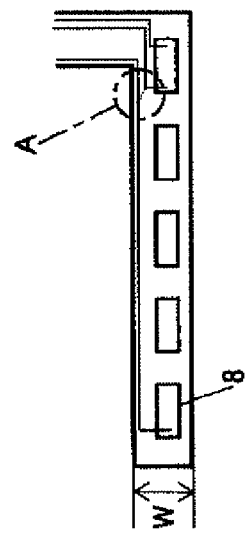
FIG. 9A is a diagram illustrating a modification example of the flexible printed wiring board according to the embodiments of the present invention.

FIGS. 9A to 9C each are a diagram illustrating a modification example of the flexible printed wiring board (FPC) according to the second embodiment described above. It should be noted that FIGS. 9A to 9C each illustrate a case where the number of the LEDs 8 is five.

FIG. 9A illustrates a case where the connection part between the connection substrate 23 and the LED substrate 24 is formed at one end of the LED substrate 24, FIG. 9B illustrates a case where the connection part is formed on the LED substrate 24 with respect to the connection substrate 23 by providing a space from the one end of the LED substrate 24, the space corresponding to one LED 8, and the FIG. 9C illustrates a case where the connection part is formed on the LED substrate 24 with respect to the connection substrate 23 by providing a space from the one end of the LED substrate 24, the space corresponding to two LEDs 8.

In the cases described above, the number of the anode lines and the cathode lines provided in a portion illustrated as the part A of FIG. 9A is nine, the number of the anode lines and the cathode lines provided in a portion illustrated as the part A of FIG. 9B is seven, and the number of the anode lines and the cathode lines provided in a portion illustrated as the part A of FIG. 9C is five, which means that the width W (see FIG. 9A) of the LED substrate 24 is reduced as a larger space is provided between the one end of the LED substrate 24 and the connection part formed on the LED substrate 24 with respect to the connection substrate 23.

It should be noted that, even in the first embodiment described above, it is possible to reduce the number of the anode lines and the cathode lines provided in a portion illustrated as the part A of FIG. 9A as a larger space is provided between the one end of the LED substrate 24 and the connection part formed on the LED substrate 24 with respect to the connection substrate 23, and therefore the width W (see FIG. 9A) of the LED substrate 24 may be reduced.

Further, in the embodiments described above, the cathode lines are each provided for the respective LEDs 8 while providing the anode line which is commonly used by the respective LEDs 8. However, the anode lines may be provided for the respective LEDs 8, while providing the cathode line which is commonly used by the respective LEDs 8.

As described above, in the liquid crystal display device according to the second embodiment, a single-sided flexible printed wiring board may be used as the LED substrate 24, which prevents the LED substrate 24 from being formed downwards the reflection sheet 7, with the result that it is possible to reduce the thickness of the liquid crystal display device.

While there has been specifically described in the above the invention made by the inventors with reference to the embodiments thereof, the present invention is not limited to the embodiments described above and obviously may be subjected to various modifications without departing from the scope thereof.

What is claimed is:

1. A liquid crystal display device, comprising:
    a liquid crystal display panel including a first substrate, a second substrate, and liquid crystal held between the first substrate and the second substrate;
    a backlight;
    a flexible printed wiring board connected to a part of the first substrate, the flexible printed wiring board including an interface part;
    a light-emitting diode substrate which has a plurality of light-emitting diodes mounted thereon;
    a connection substrate for connecting the light-emitting diode substrate and the flexible printed wiring board to each other;
    a plurality of first lines for supplying a first power supply voltage to each of the plurality of light-emitting diodes, the plurality of first lines being equal in number to the plurality of light-emitting diodes; and
    a plurality of second lines for supplying a second power supply voltage to each of the plurality of light-emitting diodes, the plurality of second lines being equal in number to the plurality of light-emitting diodes, wherein:
    the plurality of first lines and the plurality of second lines are formed on the flexible printed wiring board, on the light-emitting diode substrate, and on the connection substrate;
    the plurality of first lines and the plurality of second lines are arranged, on the light-emitting diode substrate, so that each of the plurality of first lines and each of the plurality of second lines are formed in a pair without intersecting with one another, for each of the plurality of light-emitting diodes;
    the plurality of first lines and the plurality of second lines are arranged, on the connection substrate, in the same direction as a direction in which the plurality of light-emitting diodes mounted on the light-emitting diode substrate are arranged; and
    the plurality of first lines formed on the flexible printed wiring board are connected, via a switching line formed on a surface of the flexible printed wiring board, to a common line connected to the interface part, the surface being opposite to a surface on which the plurality of first lines are formed.

2. The liquid crystal display device according to claim 1, wherein:
    any of the plurality of first lines also serves as the common line;
    the plurality of first lines other than the any one of the plurality of first lines also serving as the common line are connected, on the flexible wiring board, to the switching line via a contact hole; and
    the switching line is connected, via another contact hole, to the any one of the plurality of first lines also serving as the common line.

3. The liquid crystal display device according to claim 1, wherein:
    the plurality of first lines and the plurality of second lines include, on the light-emitting diode substrate, a first group of the plurality of first lines and the plurality of the second lines and a second group of the plurality of first lines and the plurality of the second lines, the first group and the second group sandwiching a connection part for connecting the light-emitting diode substrate to the connection substrate, the plurality of first lines and the plurality of the second lines of the first group extending in a left direction with respect to the connection part, the plurality of first lines and the plurality of the second lines of the second group extending in a right direction with respect to the connection part; and
    the first group and the second group are different from each other in number of the plurality of first lines and the plurality of second lines.

4. The liquid crystal display device according to claim 1, wherein:
    the flexible printed wiring board includes a double-sided printed wiring board; and
    the light-emitting diode substrate and the connection substrate each include a single-sided printed wiring board.

5. The liquid crystal display device according to claim 4, wherein the light-emitting diode substrate and the connection substrate are formed integrally with each other.

6. The liquid crystal display device according to claim 1, wherein the connection substrate includes a substrate in an elongated shape which is smaller in width than the light-emitting diode substrate.

7. The liquid crystal display device according to claim 1, further comprising a mold frame, wherein:
    the connection substrate is folded; and
    the plurality of light-emitting diodes mounted on the light-emitting diode substrate are accommodated in the mold frame from a side of the mold frame, the side being opposite to a side where the liquid crystal display panel is provided.

* * * * *